(12) United States Patent
Zhang et al.

(10) Patent No.: US 11,665,838 B2
(45) Date of Patent: May 30, 2023

(54) OUTER BOX AND OUTDOOR EQUIPMENT WITH THE SAME

(71) Applicant: Fulian Precision Electronics (Tianjin) Co., LTD., Tianjin (CN)

(72) Inventors: Ya-Ni Zhang, Tianjin (CN); Han-Yu Li, New Taipei (TW); Ming-Hua Duan, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 438 days.

(21) Appl. No.: 16/895,151

(22) Filed: Jun. 8, 2020

(65) Prior Publication Data
US 2021/0195769 A1    Jun. 24, 2021

(30) Foreign Application Priority Data
Dec. 19, 2019 (CN) .......................... 201911315728.2

(51) Int. Cl.
*H05K 5/02* (2006.01)
*H05K 5/00* (2006.01)

(52) U.S. Cl.
CPC ......... *H05K 5/0204* (2013.01); *H05K 5/0004* (2013.01); *H05K 5/0217* (2013.01)

(58) Field of Classification Search
CPC ... H05K 5/0004; H05K 5/0204; H05K 5/0217
See application file for complete search history.

(56) References Cited

U.S. PATENT DOCUMENTS

| 6,152,552 | A | * | 11/2000 | Snoke | F16B 12/38 |
| | | | | | 312/263 |
| 8,684,803 | B2 | * | 4/2014 | Berkompas | F24F 13/082 |
| | | | | | 454/277 |
| 11,266,032 | B2 | * | 3/2022 | Zhang | H05K 5/0213 |
| 2014/0268566 | A1 | * | 9/2014 | Dolan | H05K 5/02 |
| | | | | | 361/679.01 |
| 2020/0113082 | A1 | * | 4/2020 | Yang | H04Q 1/025 |

FOREIGN PATENT DOCUMENTS

| CN | 201878455 | U | | 6/2011 |
| CN | 201898684 | U | | 7/2011 |
| CN | 204786898 | U | * | 11/2015 |
| CN | 107120745 | A | * | 9/2017 |
| CN | 108174465 | A | * | 6/2018 |
| CN | 207937664 | U | * | 10/2018 |
| CN | 207937664 | U | | 10/2018 |
| CN | 109723340 | A | * | 5/2019 |
| JP | 2016139916 | A | * | 8/2016 | ............. F16M 13/02 |

\* cited by examiner

*Primary Examiner* — Matthew W Ing
(74) *Attorney, Agent, or Firm* — ScienBiziP, P.C.

(57) ABSTRACT

An outer box includes an outer case including a rear wall; and a fixing device fixed on the rear wall. The fixing device includes a first fixing member, a second fixing member, at least two fixing rods, and at least two fastening members. The first fixing member is fixed on the rear wall. The at least two fixing rods are connected with the first fixing member. At least one of the at least two fixing rods is slidably connected with the first fixing member. The second fixing member is slidably arranged on the at least two fixing rods, the at least two fastening members are fixed with the at least two fixing rods respectively so as to limit the movement of the second fixing member along the at least two fixing rods.

16 Claims, 10 Drawing Sheets

OUTER BOX AND OUTDOOR EQUIPMENT WITH THE SAME

FIELD

The subject matter herein generally relates to electronic equipment, and particularly to an outer box and outdoor equipment with the outer box.

BACKGROUND

Sometimes, some equipment needs to be installed outdoors, such as communication equipment and air conditioning equipment. In order to protect the outdoor equipment, the outdoor equipment is generally fixed onto a fixed object.

BRIEF DESCRIPTION OF THE DRAWINGS

Implementations of the present disclosure will now be described, by way of embodiment, with reference to the attached figures.

DETAILED DESCRIPTION

Figure 1:
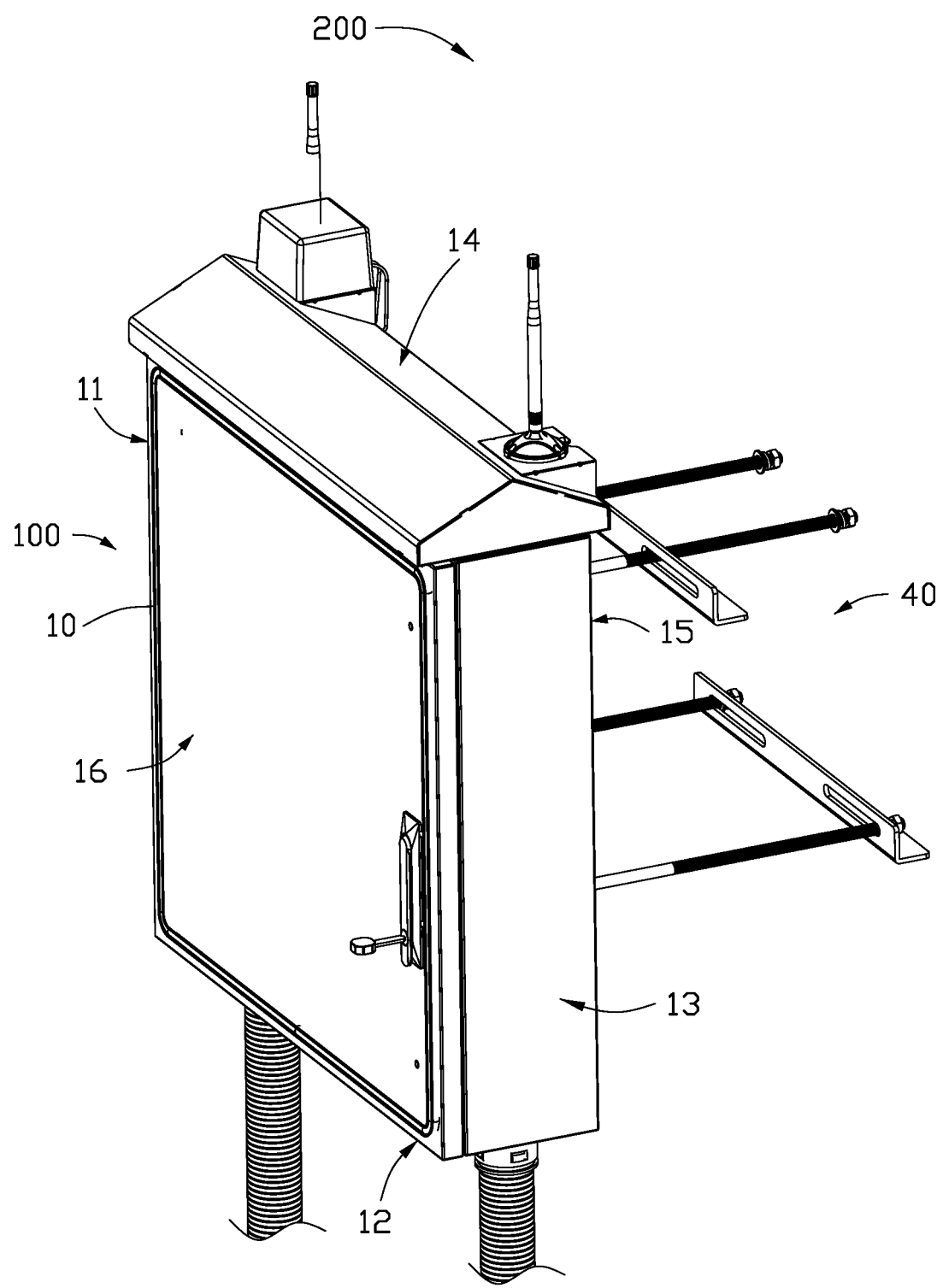
FIG. 1 is a schematic diagram of outdoor equipment according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". In addition, the terms "first", "second", "third", and "fourth" are used for descriptive purposes only and cannot be understood as indicating or implying relative importance or implying the number of indicated technical features. Thus, the features defined as "first" and "second" may explicitly or implicitly include one or more of the said features. In the description of embodiments of the invention, "a plurality of" means two or more, unless otherwise specifically defined.

The terms "top", "bottom", "perpendicular", "parallel", "upper", "lower", "inside", "outside", and other indicating directions or positions are based on the directions or positions shown in the attached drawings In order to facilitate the description of the embodiment and simplify the description of the invention, rather than indicating or implying that the device or element referred to must have a specific orientation, be constructed and operated in a specific orientation, it cannot be understood as a limitation of the embodiment of the invention.

Figure 2:
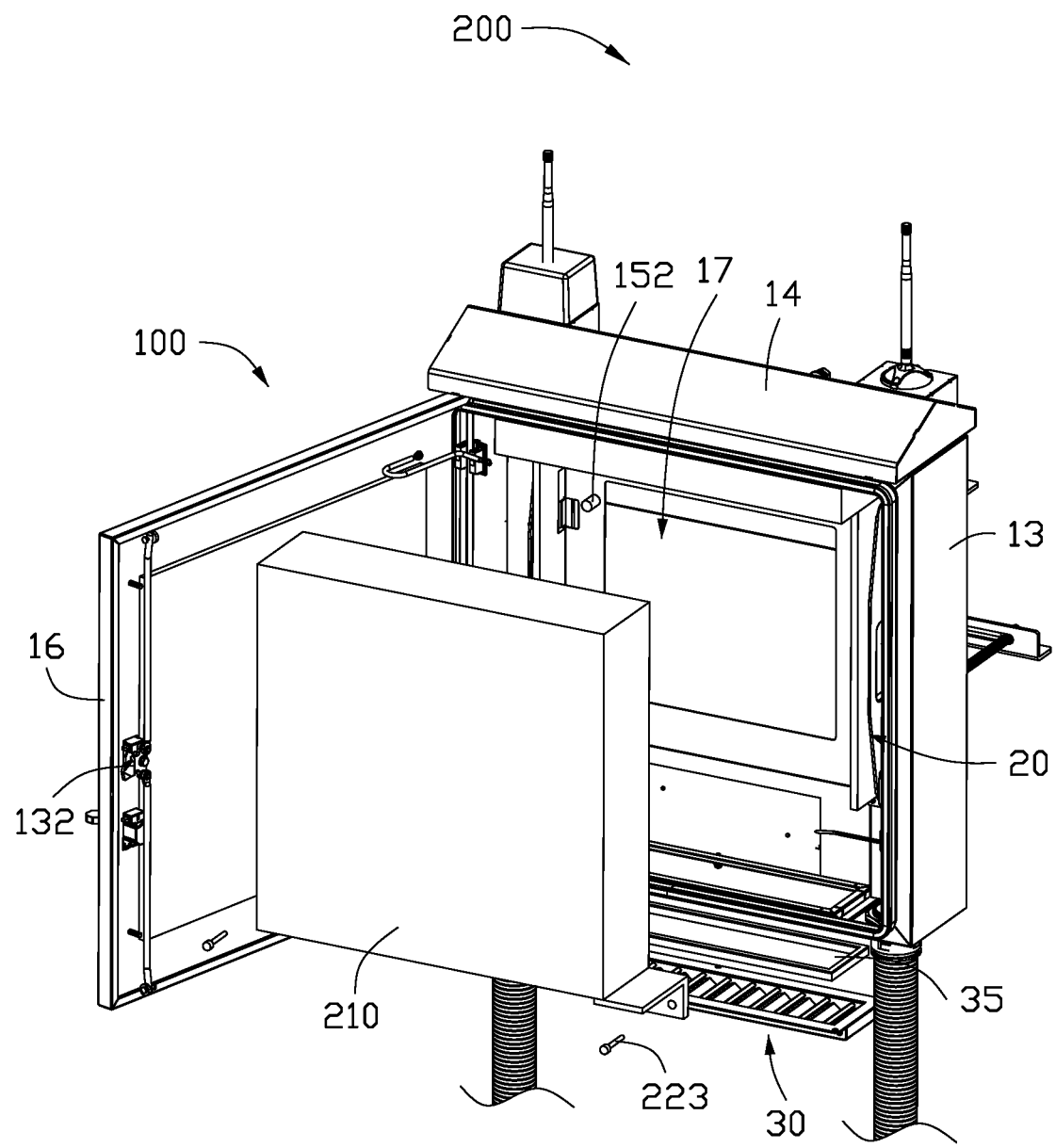
FIG. 2 illustrates an exploded view of the outdoor equipment of FIG. 1, an outer case including a tray.

Referring to FIGS. 1 and 2, an embodiment of the present disclosure provides outdoor equipment 200. The outdoor equipment 200 includes an outer box 100 and elements 210 located inside the outer box 100. The outdoor equipment 200 can be arranged outside. The outdoor equipment 200 can be, but is not limited to, communication equipment, or air condition equipment. The outer box 100 includes an outer case 10, at least one guiding structure 30, a dustproof net 35, a tray 20, and a fixing device 40.

The outer case 10 includes a first side wall 11, a bottom wall 12, a second side wall 13, a top wall 14, a rear wall 15, and a front wall 16. The rear wall 15 and the front wall 16 are substantially rectangle shaped. The first side wall 11, the bottom wall 12, the second side wall 13, and the top wall 14 are connected in sequence and perpendicular to the rear wall 15. The first side wall 11 and the second side wall 13 are opposite to each other. The bottom wall 12 and the top wall 14 are opposite to each other. The first side wall 11, the bottom wall 12, the second side wall 13, the top wall 14, the rear wall 15, and the front wall 16 constitute a rectangle accommodating area 17. The accommodating area 17 is configured to accommodate the elements 210. In the embodiment, the elements 210 include a server.

In at least one embodiment, the accommodating area 17 may be in any other suitable shape, such as a circular shape or a trapezoid.

The front wall 16 can be switchable to be connected with the second side wall 13 or away from the second side wall 13 so as to close or open the accommodating area 17. That is, the front wall 16 can be used as a door of the outer case 10. The front wall 16 is pivotably connected with the first side wall 11. A lock 132 is arranged on the second side wall 13 to lock or unlock the accommodating area 17, thus facilitating maintenance of the elements 210.

The top wall 14 is V shaped and extends from a top of the top wall 14 towards the rear wall 15 and the front wall 16, respectively.

Figure 3:
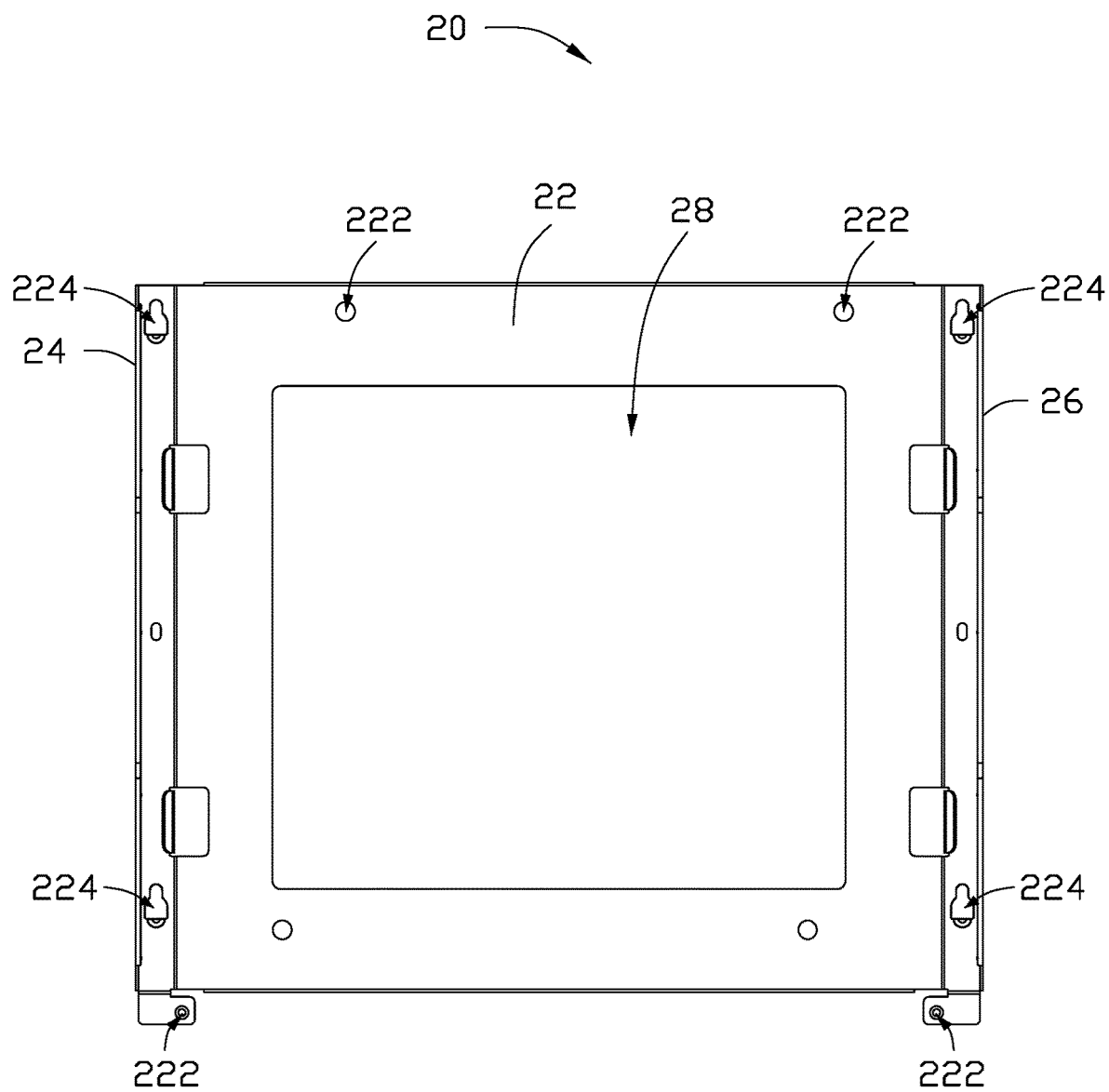
FIG. 3 is a schematic diagram of the tray of FIG. 2 according to an embodiment of the present disclosure.

Referring to FIG. 3, the tray 20 includes a flat plate 22, a first side plate 24, and a second side plate 26 arranged at two opposite ends of the flat plate 22. The first side plate 24 and the second side plate 26 are located in the same side of the flat plate 22. The flat plate 22 together with the first side plate 24 and the second side plate 26 forms a receiving area 28 for receiving the elements 210. The flat plate 22 defines a first through hole 222, the first through hole 222 is configured to allow fixing elements like screws to pass therethrough so as to fix the elements 210 inside the tray 20. The flat plate 22 further defines a plurality of mounting holes 224. The mounting holes 224 are arranged on the flat plate 22 adjacent to the first side plate 24 and/or the second side plate 26, and configured to mount the tray 20 onto the rear wall 15.

A plurality of mounting protrusions 152 extends from the rear wall 15 and corresponds to the plurality of mounting holes 224. The mounting protrusions 152 are configured to pass through the mounting holes 224 respectively so as to mount the tray 20 to the rear wall 15. In this way, the tray 20 can be easily mounted on the rear wall 15 and taken away from the rear wall 15. In the embodiment, the mounting protrusions 152 can be I-shaped. In at least one embodiment, the mounting holes 224 can be defined in the rear wall 15 while the mounting protrusions 152 can be arranged on the flat plate 22.

Figure 4:
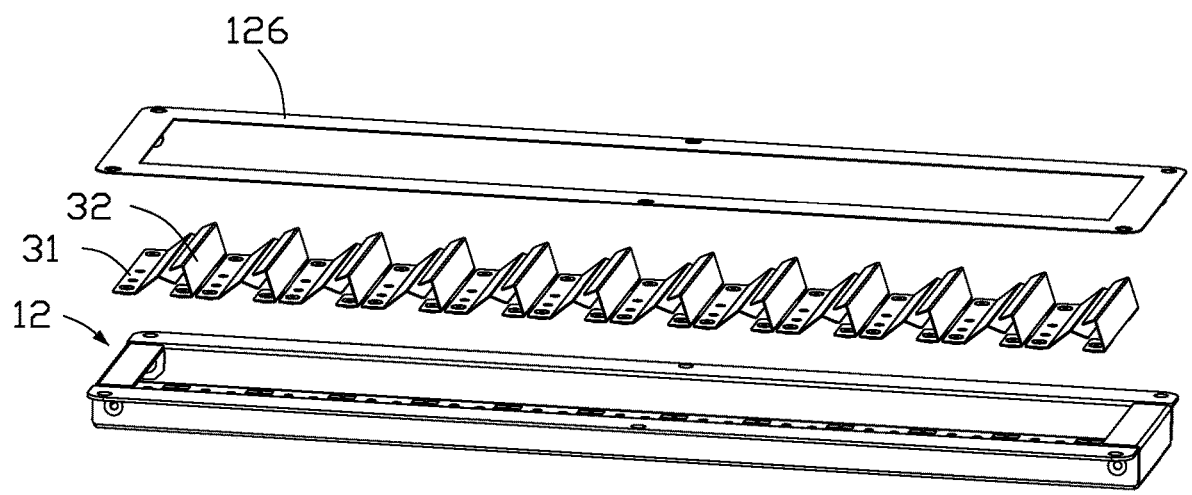
FIG. 4 is an exploded view of a bottom wall, a first guiding plate, and a second guiding plate of the outdoor equipment of FIG. 1 according to a first embodiment of the present disclosure.
Figure 5:
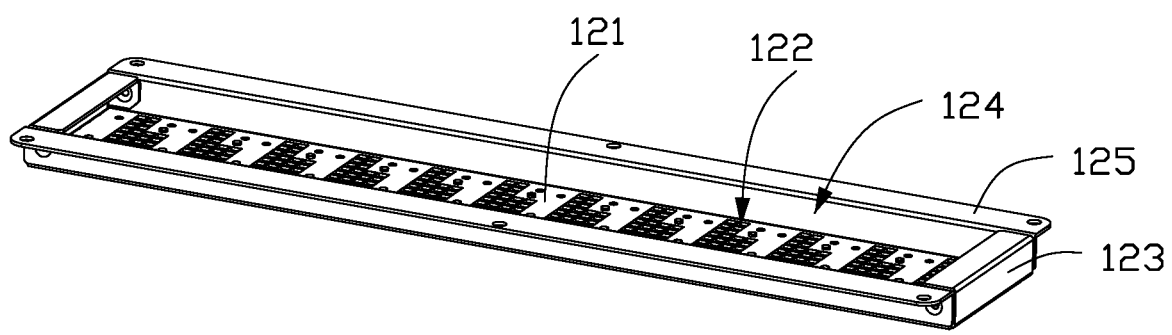
FIG. 5 is a schematic diagram of the bottom wall of FIG. 4 according to an embodiment of the present disclosure.

Referring to FIGS. 4 and 5, the bottom wall 12 is arranged at a bottom of the outer case 10. The bottom wall 12 may include a bottom plate 121, and a plurality of side plates 123 surrounding the bottom plate 121. The angle between the side plates 123 and the bottom plate 121 is 90. In at least one embodiment, the angle between the side plates 123 and the bottom plate 121 can be greater or less than 90. The bottom plate 121 together with the plurality of side plates 123 forms a receiving space 124. A plurality of first guiding plates 31 and a plurality of second guiding plates 32 are arranged in the receiving space 124.

The bottom plate 121 defines a plurality of second through holes 122. The plurality of second through holes 122 is configured for ventilation and heat dissipation, thus the bottom plate 121 can prevent dust or outdoor trash from entering the outer case 10, such as leaves or papers.

Figure 6:
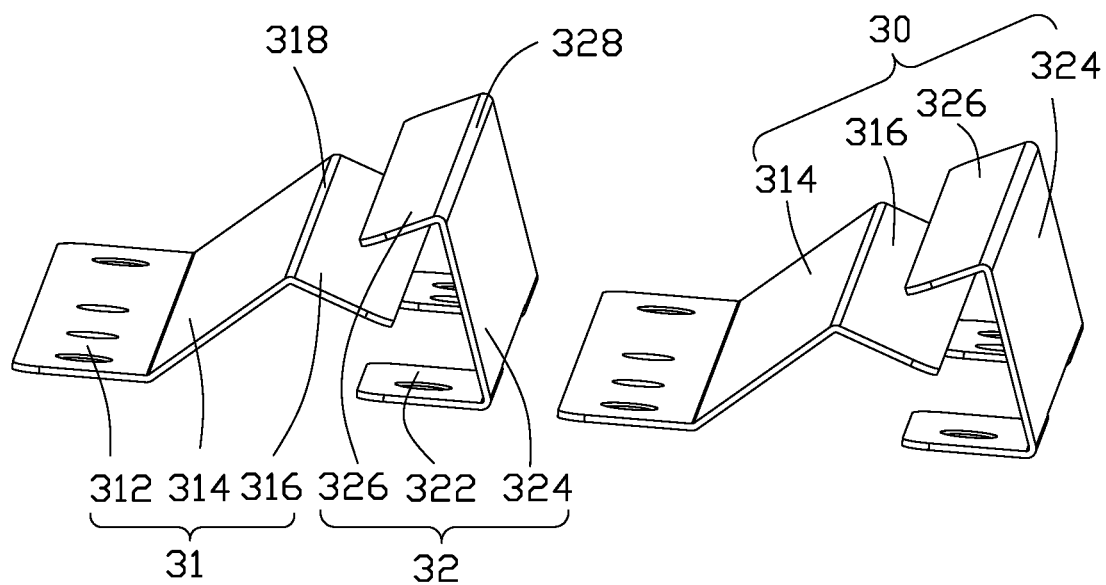
FIG. 6 is a schematic diagram of the first guiding plate and the second guiding plate of FIG. 4.

Referring to FIG. 6, the first guiding plate 31 includes a first mounting part 312, a first blocking part 316, and a first connecting part 314 interconnecting the first mounting part 312 and the first blocking part 316. In the embodiment, the first mounting part 312 and the first blocking part 316 are arranged at two different sides of the first connecting part 314. The first mounting part 312 extends from a first end of the first connecting part 314 along a first direction, and the first blocking part 316 extends from a second end of the first connecting part 314 away from the first end along a second direction. The second direction is different from the first direction. An angel between the first mounting part 312 and the first connecting part 314 can be the same or different from an angle between the first blocking part 316 and the first connecting part 314. The first connecting part 314 and the first blocking part 316 meet at a first joint 318. The first mounting part 312 can be mounted to the bottom plate 121 by bonding or a screw connection.

In at least one embodiment, the first mounting part 312 and the first blocking part 316 may be arranged at the same side of the first connecting part 314.

The second guiding plate 32 includes a second mounting part 322, a second blocking part 326, and a second connecting part 324 interconnecting the second mounting part 322 and the second blocking part 326. The second mounting part 322 and the second blocking part 326 are arranged in the same side of the second connecting part 324. The second mounting part 322 extends from a third end of the second connecting part 324 along a third direction, and the second blocking part 326 extends from a fourth end of the second connecting part 324 away from the third end along a fourth direction. The fourth direction can be the same or different from the third direction. An angel between the second mounting part 322 and the second connecting part 324 can be the same or different from an angle between the second blocking part 326 and the second connecting part 324. The second connecting part 324 and the second blocking part 326 meet at a second joint 328. The second mounting part 322 can be used to mount the second guiding plate 32 on the bottom plate 121 of the bottom wall 12 by bonding or a screw connection. The second connecting part 324 and the second blocking part 326 can be used to guiding air flow and/or water flow.

In at least one embodiment, the second mounting part 322 and the second blocking part 326 can be arranged at two opposite sides of the second connecting part 324.

The plurality of first guiding plates 31 and the plurality of second guiding plates 32 are arranged alternatively in turn. The first connecting part 314 and the first blocking part 316 of each of the first guiding plates 31 together with the second connecting part 324 and the second blocking part 326 of the adjacent second guiding plate 32 constitute the guiding structure 30.

Figure 7:
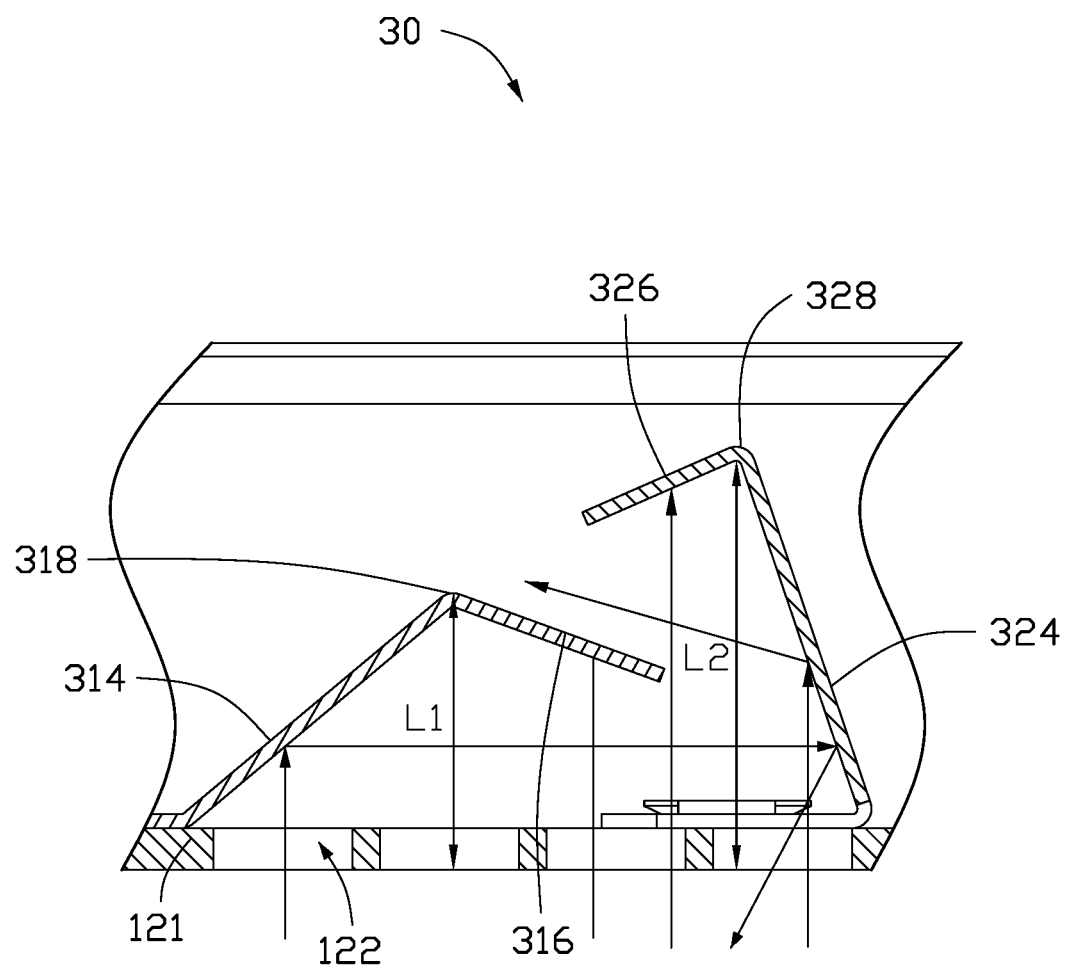
FIG. 7 is a cross sectional view of the first guiding plate and the second guiding plate of FIG. 6.

Referring to FIG. 7, the first guiding plate 31 is mounted on the bottom wall 12 with the first mounting part 312 connected with the bottom plate 121, and the second guiding plate 32 is mounted on the bottom wall 12 with the second mounting part 322 connected with the bottom plate 121. A first distance L1 from the first joint 318 to the bottom plate 121 is less than a second distance L2 from the second joint 328 to the bottom plate 121. The first blocking part 316 is arranged at a side of the second blocking part 326 adjacent to the second through holes 122. An angle between the first blocking part 316 and the bottom plate 121 is less than an angle between the second blocking part 326 and the bottom plate 121.

The first blocking part 316 is suspended on the bottom plate 121 through the first connecting part 314 and extends towards the bottom plate 121, the second blocking part 326 is suspended on the bottom plate 121 through the second connecting part 324 and the second blocking part 326 extends towards the bottom plate 121. The first blocking part 316 and the second blocking part 326 are staggered, in other words, the projection of the first blocking part 316 on the bottom plate 121 overlaps the projection of the second blocking part 326 on the bottom plate 121. Thus, water can be prevented from directly entering the interior of the outer case 10 through the second through holes 122.

Water flow inside the outer case 10 can flow out through the second through holes 122 and then flow out of the outer case 10 under the guide of the guiding structures 30. When unwanted water flow enters the outer case 10 from the second through holes 122, part of the water flow can flow out from the second through holes 122 under gravity and then fall onto the second blocking part 326 due to gravity of the water flow and a counterforce of the first connecting part 314, the first blocking part 316, the second connecting part 324, and the second blocking part 326 exerted on the water flow. For example, part of the water can flow out from the second through holes 122 and fall down onto the first connecting part 314. The part of the water hits the first connecting part 314, at the same time, a counterforce of the first connecting part 314 may push the part of the water towards the second connecting part 324. The part of water may fall down to the second blocking part 326 or be pushed toward outside of the guiding structures 30 through a gap between the first blocking part 316 and the second blocking part 326. Finally, the water falling down on the second blocking part 326 may fall off the second blocking part 326 due to gravity.

Air flow inside the outer case 10 can flow out through the second through holes 122 and then flow out of the outer case 10 under the guide of the guiding structures 30. On the other hand, air flow outside can flow into the outer case 10 under the guide of the guiding structures 30. In detail, air flow inside the outer case 10 can flow out through the second through holes 122, and then flow out of the guiding structures 30 through the gap between the first blocking part 316 and the second blocking part 326 under a combination of impact forces of the air flow exerted on the first connecting part 314, the first blocking part 316, the second connecting part 324, and the second blocking part 326, and reacting forces of the first connecting part 314, the first blocking part 316, the second connecting part 324, and the second blocking part 326 exerted on the air flow. Air flow outside the outer case 10 can flow into the guiding structures 30 through the gap between the first blocking part 316 and the second blocking part 326, and then flow into the outer case 10 under a combination of impact forces of the air flow exerted on the first connecting part 314, the first blocking part 316, the second connecting part 324, and the second blocking part 326, and counterforces of the first connecting part 314, the first blocking part 316, the second connecting part 324, and the second blocking part 326 exerted on the air flow. The counterforces act on the air flow in a similar manner with those act on the water flow.

In at least one embodiment, the outer case 10 may include a plurality of the guiding structures 30 arranged along a line. Alternatively, in at least one embodiment, the plurality of the guiding structures 30 may be arranged in any suitable pattern to meet all kinds of ventilation requirements.

Figure 8:
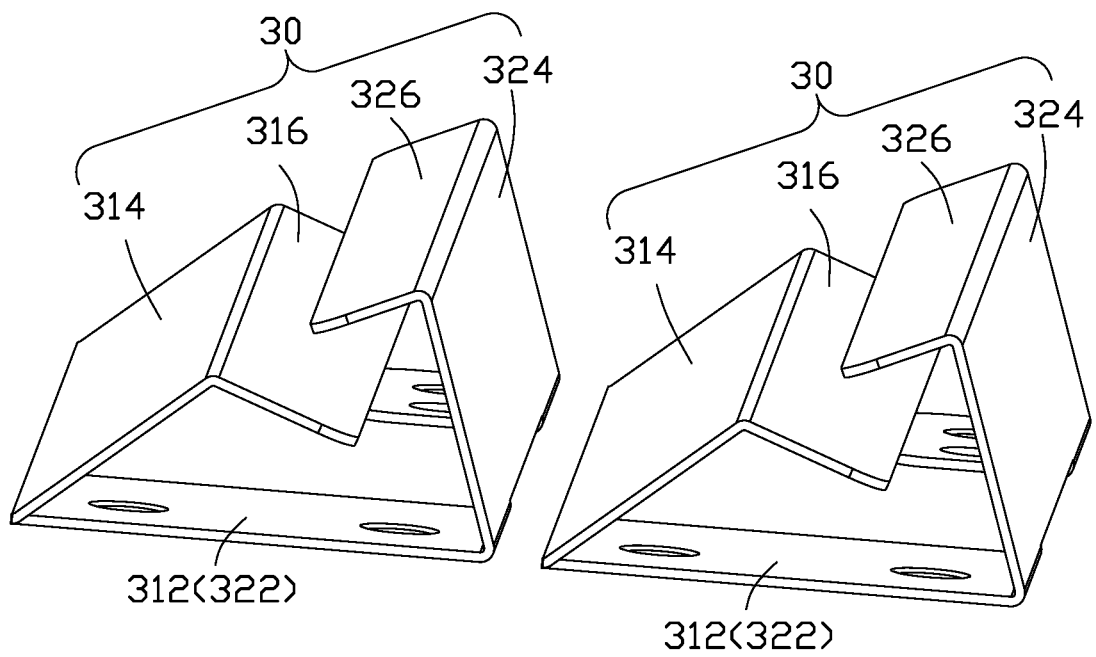
FIG. 8 is a schematic diagram of the first guiding plate and the second guiding plate according to a second embodiment of the present disclosure.
Figure 9:
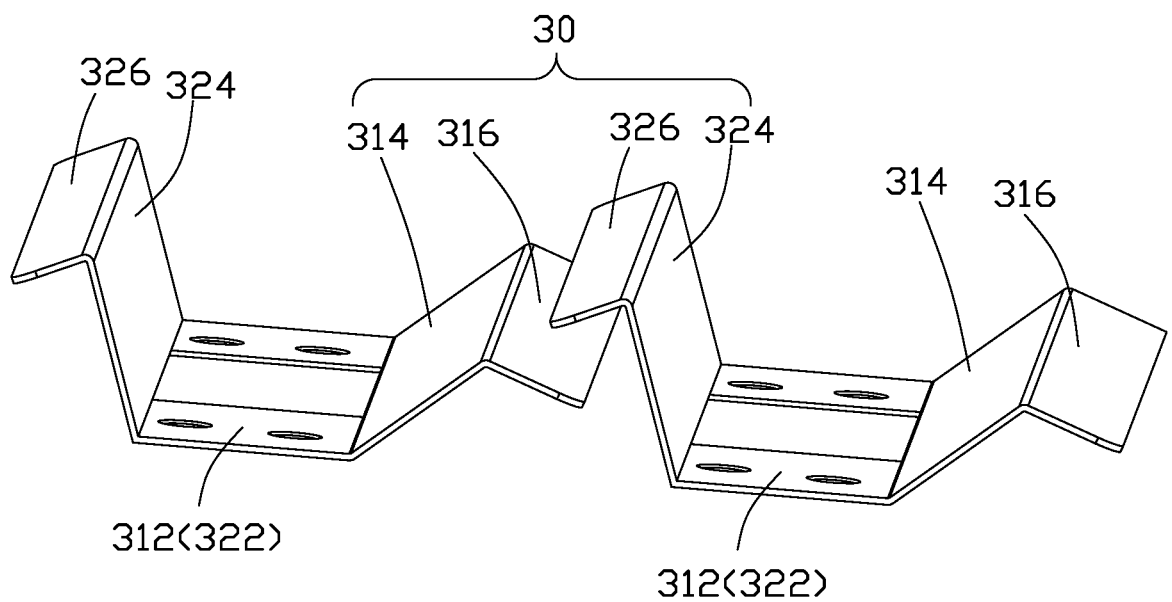
FIG. 9 is a schematic diagram of the first guiding plate and the second guiding plate according to a third embodiment of the present disclosure.

Referring to FIGS. 8 and 9, the first guiding plate 31 and the second guiding plate 32 may be formed integrally. In such arrangement, the first mounting part 312 and the second mounting part 322 can be integrated into one element. The first connecting part 314 and the second connecting part 324 are arranged at two opposite sides of the first mounting part 312 (the second mounting part 322). The first blocking part 316 is arranged at an end of the first connecting part 314 away from the first mounting part 312, and the second blocking part 326 is arranged at an end of the second connecting part 324 away from the second mounting part 322. In FIG. 8, an angle between the first mounting part 312 and the first connecting part 314 and an angle between the first mounting part 312 and the second connecting part 324 are both acute angles. The first mounting part 312, the first connecting part 314, the first blocking part 316, the second connecting part 324, and the second blocking part 326 form the guiding structure 30. In FIG. 9, the angle between the first mounting part 312 and the first connecting part 314 and the angle between the first mounting part 312 and the second connecting part 324 are both obtuse angles. The first connecting part 314 and the first blocking part 316 of one of the plurality of first guiding plates 31 together with the second connecting part 324 and the second blocking part 326 of an adjacent one of the plurality of second guiding plates 32 form the guiding structure 30.

Referring back to FIG. 5, the bottom wall 12 further includes a third mounting part 125 extending away from the side plates 123. The third mounting part 125 is substantially parallel to the bottom plate 121. The outer case 10 includes a fourth mounting part (not shown) corresponding to the third mounting part 125. The fourth mounting part can be arranged at a bottom of at least one of the rear wall 15, the first side wall 11, and the second side wall 13. The bottom wall 12 can be mounted with the outer box 100 by interconnecting the third mounting part 125 and the fourth mounting part.

The outer box 100 further includes a waterproof cushion 126 (shown in FIG. 4) arranged between the third mounting part 125 and the fourth mounting part. The waterproof cushion 126 is in the same shape with the third mounting part 125 and/or the fourth mounting part. The waterproof cushion 126 can enhance a tight connection between the third mounting part 125 and the fourth mounting part tighter and thus improve waterproof performance of the outer box 100.

The dustproof net 35 is arranged on the guiding structure 30 away from the bottom wall 12. The dustproof net 35 is arranged adjacent the guiding structure 30, thus capable of preventing dust from entering the outer box 100.

Figure 10:
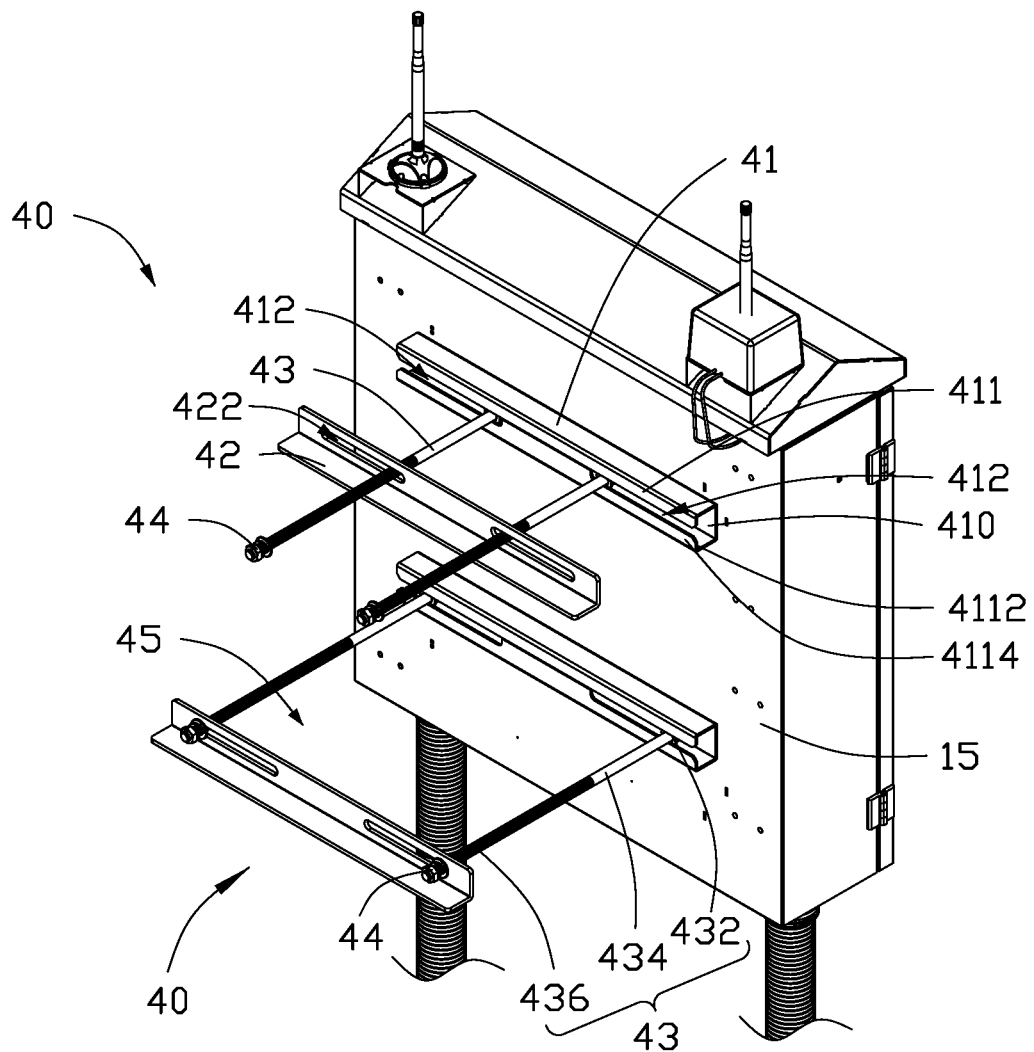
FIG. 10 is a schematic diagram of the outdoor equipment of FIG. 1 taken from another view.

Referring to FIG. 10, the fixing device 40 is arranged on a surface of the rear wall 15 away from the front wall 16. In other words, the fixing device 40 is arranged outside the outer box 100. The fixing device 40 includes a first fixing member 41, a second fixing member 42, and at least two fixing rods 43.

The first fixing member 41 is arranged on the rear wall 15 and in a hollow elongated structure. The first fixing member 41 includes a first fixing plate 410 fixed on the rear wall 15 and a second fixing plate 411 formed at an end of the first fixing plate 410 away from the rear wall 15. The second fixing plate 411 includes a first surface 4112 facing the rear wall 15 and a second surface 4114 facing away the rear wall 15. The second fixing plate 411 defines at least one first guiding slot 412. In the embodiment, the number of the at least one first guiding slot 412 is two, and the two first guiding slots 412 are defined at two opposite sides of the second fixing plate 411. The at least one first guiding slot 412 substantially extends along the horizontal direction.

In at least one embodiment, the number of the at least one first guiding slot 412 can be one.

The second fixing member 42 is movably arranged on the at least two fixing rods 43. The second fixing member 42 defines at least one second guiding slot 422 corresponding to the at least one first guiding slot 412. In the embodiment, the number of the at least one second guiding slot 422 can be same with the number of the at least one first guiding slot 412. The at least two fixing rods 43 pass through the at least one second guiding slot 422.

Each of the at least two fixing rods 43 includes a limit part 432, a fastening part 436, and an interconnecting part 434 interconnecting the limit part 432 and the fastening part 436. The limit part 432 can be arranged and limited inside the first fixing member 41 through the first guiding slot 412. The interconnecting part 434 passes through the first guiding slot 412. The fastening part 436 passes through the second guiding slot 422. A fastening member 44 is fastened with the fastening part 436 so as to limit the movement of the second fixing member 42 along the at least two fixing rods 43. In the embodiment, the number of the at least two fixing rods 43 is two. The two fixing rods 43 can slide along the first guiding slot 412 and the second guiding slot 422 so as to adjust a distance between the two fixing rods 43. The first fixing member 41, the second fixing member 42, and the two fixing rods 43 defines a securing space 45. The securing space 45 can surround and be fixed onto a fixed object, such as a fixed pole. In at least one embodiment, the fastening member 44 is a thread nut, and the fastening part 436 is a thread part. The size of the securing space 45 can be adjusted to fit all kinds of fixed objects by adjusting sliding the fixing rod 43 along the first guiding slots 412 and the second guiding slots 422 and screwing the fastening member 44 along the fastening part 436.

In at least one embodiment, the number of the fixing device 40 can be two.

The outer box 100 of the present disclosure can be applied in outdoor equipment. The fixing device 40 of the outer box 100 can facilitate easy mounting the outer box 100 onto a fixed object in any size.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. An outer box comprising:
    an outer case comprising a rear wall, a first side wall, a bottom wall, a second side wall, a top wall, and a front wall, wherein the first side wall, the bottom wall, the second side wall, and the top wall are connected in sequence and surround the rear wall, the first side wall, the bottom wall, the second side wall, the top wall, the front wall, and the rear wall define an accommodating area, the front wall is configured to close or open the accommodating area;
    a fixing device fixed on the rear wall, wherein the fixing device comprises a first fixing member, a second fixing member, at least two fixing rods, and at least two fastening members, the first fixing member is fixed on the rear wall, an end of each of the at least two fixing rods is connected with the first fixing member, at least one of the at least two fixing rods slidably connected with the first fixing member, the second fixing member slidably arranged on the at least two fixing rods, the at least two fastening members are fixed with the at least two fixing rods respectively so as to limit the movement of the second fixing member along the at least two fixing rods, the first fixing member together with the at least two fixing rods and the second fixing member defines a securing space; and
    a plurality of guiding structures arranged on the bottom wall, wherein the bottom wall defines a plurality of second through holes, each of the plurality of guiding structures includes a first guiding plate and a second guiding plate, the first guiding plate includes a first connecting part and a first blocking part connected with the first connecting part, the second guiding plate includes a second connecting part and a second blocking part connected with the second connecting part, the first connecting part and the second connecting part face each other; the first blocking part is suspended on the bottom wall through the first connecting part and extends from the first connecting part towards the bottom wall, the second blocking part is suspended on the bottom wall through the second connecting part and extends from the second connecting part towards the bottom wall, the first blocking part and the second blocking part are staggered, a projection of the first blocking part on the bottom wall and a projection of the second blocking part on the bottom wall partially coincide.

2. The outer box according to claim 1, wherein the first fixing member comprises a first fixing plate fixed on the rear wall, and a second fixing plate formed at an end of the first fixing plate away from the rear wall, the second fixing plate defines at least two first guiding slots, the second fixing member defines at least two second guiding slots corresponding to the at least two first guiding slots, each of the at least two fixing rods passes through one of the at least two second guiding slots and one of the at least two first guiding slots in sequence.

3. The outer box according to claim 1, further comprising a tray, wherein the tray includes a flat plate, a first side plate and a second side plate respectively arranged at two opposite ends of the flat plate, the flat plate together with the first side plate and the second side plate defines a receiving area.

4. The outer box according to claim 3, wherein the flat plate defines a plurality of first through holes for fastening elements passing therethrough to fix elements on the tray.

5. The outer box according to claim 3, wherein one of the flat plate and the rear wall defines a plurality of mounting holes, the other one of the flat plate and the rear wall extends a plurality of mounting protrusions configured to pass through the plurality of mounting holes respectively so as to mount the tray to the rear wall.

6. The outer box according to claim 1, wherein an angle between the first blocking part and the bottom wall is less than an angle between the second blocking part and the bottom wall.

7. The outer box according to claim 1, wherein a distance from a first joint where the first connecting part and the first blocking part meet to the bottom wall is less than a distance from a second joint where the second connecting part and the second blocking part meet to the bottom wall.

8. The outer box according to claim 1, wherein the first guiding plate and the second guiding plate are integrally formed, the first connecting part and the second connecting part are connected by a mounting part which is connected with the bottom wall.

9. An outdoor equipment comprising an outer box, wherein the outer box comprises:
    an outer case comprising a rear wall, a first side wall, a bottom wall, a second side wall, a top wall, and a front wall, wherein the first side wall, the bottom wall, the second side wall, and the top wall are connected in sequence and surround the rear wall, the first side wall, the bottom wall, the second side wall, the top wall, the front wall, and the rear wall define an accommodating area, the front wall is configured to close or open the accommodating area;
    a fixing device fixed on the rear wall, wherein the fixing device comprises a first fixing member, a second fixing member, at least two fixing rods, and at least two fastening members, the first fixing member is fixed on the rear wall, an end of each of the at least two fixing rods is connected with the first fixing member, at least one of the at least two fixing rods slidably connected with the first fixing member, the second fixing member slidably arranged on the at least two fixing rods, the at least two fastening members are fixed with the at least two fixing rods respectively so as to limit the movement of the second fixing member along the at least two fixing rods, the first fixing member together with the at least two fixing rods and the second fixing member defines a securing space; and
    a plurality of guiding structures arranged on the bottom wall, wherein the bottom wall defines a plurality of second through holes, each of the plurality of guiding structures includes a first guiding plate and a second guiding plate, the first guiding plate includes a first connecting part and a first blocking part connected with the first connecting part, the second guiding plate includes a second connecting part and a second blocking part connected with the second connecting part, the first connecting part and the second connecting part face each other; the first blocking part is suspended on the bottom wall through the first connecting part and extends from the first connecting part towards the bottom wall, the second blocking part is suspended on the bottom wall through the second connecting part and extends from the second connecting part towards the bottom wall, the first blocking part and the second blocking part are staggered, a projection of the first blocking part on the bottom wall and a projection of the second blocking part on the bottom wall partially coincide.

10. The outdoor equipment according to claim 9, wherein the first fixing member comprises a first fixing plate fixed on the rear wall, and a second fixing plate formed at an end of the first fixing plate away from the rear wall, the second fixing plate defines at least two first guiding slots, the second fixing member defines at least two second guiding slots corresponding to the at least two first guiding slots, each of the at least two fixing rods passes through one of the at least two second guiding slots and one of the at least two first guiding slots in sequence.

11. The outdoor equipment according to claim 9, wherein the outer box further comprises a tray, the tray includes a flat plate, a first side plate and a second side plate respectively arranged at two opposite ends of the flat plate, the flat plate together with the first side plate and the second side plate defines a receiving area.

12. The outdoor equipment according to claim 11, wherein the flat plate defines a plurality of first through holes for fastening elements passing therethrough to fix elements on the tray.

13. The outdoor equipment according to claim 11, wherein one of the flat plate and the rear wall defines a plurality of mounting holes, the other one of the flat plate and the rear wall extends a plurality of mounting protrusions configured to pass through the plurality of mounting holes respectively so as to mount the tray to the rear wall.

14. The outdoor equipment according to claim 9, wherein an angle between the first blocking part and the bottom wall is less than an angle between the second blocking part and the bottom wall.

15. The outdoor equipment according to claim 9, wherein a distance from a first joint where the first connecting part and the first blocking part meet to the bottom wall is less than a distance from a second joint where the second connecting part and the second blocking part meet to the bottom wall.

16. The outdoor equipment according to claim 9, wherein the first guiding plate and the second guiding plate are integrally formed, the first connecting part and the second connecting part are connected by a mounting part which is connected with the bottom wall.

* * * * *